United States Patent

[11] 3,634,204

[72] Inventors Vir A. Dhaka
Hopewell Junction;
James L. Reuter, East Fishkill; Jagtar S. Sandhu, Fishkill, all of N.Y.
[21] Appl. No. 854,196
[22] Filed Aug. 29, 1969
[45] Patented Jan. 11, 1972
[73] Assignee Cogar Corporation
Utica, N.Y.

[54] TECHNIQUE FOR FABRICATION OF SEMICONDUCTOR DEVICE
18 Claims, 10 Drawing Figs.

[52] U.S. Cl. .......... 204/15, 29/576, 204/42, 204/43, 204/56 R, 317/235 R
[51] Int. Cl. .......... C23b 5/48, C23b 5/46, C23b 5/32
[50] Field of Search .......... 204/15, 56–58, 42, 43; 29/571; 148/1.5

[56] References Cited
UNITED STATES PATENTS

| | | | |
|---|---|---|---|
| 3,360,695 | 12/1967 | Lindmayer .......... | 317/234 |
| 3,368,113 | 2/1968 | Shaunfield .......... | 317/101 |
| 3,402,081 | 9/1968 | Lehman .......... | 148/188 |
| 3,445,924 | 5/1969 | Cheroff et al. .......... | 29/571 |
| 3,447,238 | 6/1969 | Heynes et al. .......... | 29/590 |
| 3,449,644 | 6/1969 | Nassibian .......... | 317/235 |

OTHER REFERENCES
Chemical & Ambient Effects on Surface Conduction in Passivated Silicon Semiconductors by H. S. Lehman I.B.M. Journal September 1964 pgs. 422–426

*Primary Examiner*—John H. Mack
*Assistant Examiner*—T. Tufariello
*Attorney*—Harry M. Weiss

ABSTRACT: A technique for the fabrication of a semiconductor device of the field-effect transistor-type involves a processing sequence wherein a self-aligning gate region comprising a noble metal-silicon-oxygen alloy serves as a mask for the source and drain diffusions and serves as gate electrode.

INVENTORS
VIR A. DHAKA
JAMES L. REUTER
JAGTAR S. SANDHU
BY Harry M Weiss
ATTORNEY

TECHNIQUE FOR FABRICATION OF SEMICONDUCTOR DEVICE

BACKGROUND OF THE INVENTION

This invention relates to a technique for the fabrication of semiconductor devices. More particularly, the present invention relates to a technique for the fabrication of insulated gate field-effect transistors utilizing a self-aligning gate region comprising a noble metal-silicon-oxygen alloy.

DESCRIPTION OF THE PRIOR ART

Over the past decade, the continued growth of semiconductor device technology coupled with the increasing complexity of modern electronic systems, have created an unprecedented demand for reliability of semiconductor devices. Additionally, the extraordinary terrestrial and interplanetary environments created by the space age have further increased the severity of the problems associated with device reliability.

Perhaps the most significant problem that has faced workers in the art at each incremental stage of development is stability, i.e., the necessity to avoid drift in device characteristics. The most popular procedures for obviating this difficulty have concentrated either upon removing undesirable positive charge carriers from the sites of semiconductor surfaces or erecting suitable barriers and to prevent the infringement of external positive charge impurities upon the semiconductor surface.

Recently, a technique described by James L. Reuter and Jagtar S. Sandhu in copending application, Ser. No. 825,863, filed May 19, 1969, entitled "Semiconductor Device and Fabrication Method Therefor," attained this end by means of a passivating layer comprising a composition containing silicon, oxygen and at least one noble metal selected from among platinum, gold, silver, rhodium, palladium and iridium, such passivating layer being physically situated upon at least a portion of the insulating layer of the semiconductor device of interest. This technique as described in the copending patent application permitted both the formation of a barrier layer against contamination and permitted contaminants to be removed from the semiconductor surface areas.

Briefly, this technique, as described in the copending application, applied to insulating gate field-effect transistors involves subjecting a semiconductor material having a layer of an insulating material on at least one surface thereof to conventional photoengraving techniques, so resulting in a structure bearing a mask of an insulating material. Thereafter, source and drain regions are formed in the semiconductor material by well-known diffusion techniques, the passivating layer of interest formed, and suitable ohmic contacts applied.

This technique can be further significantly improved by changing this sequence of operations wherein the insulating mask and barrier layer are formed prior to the diffusion step to permit reproducible source, drain and gate space relationship. This would eliminate any uncertainties in the gate electrode alignment, thereby resulting in a decrease in device capacitance and reduction of component size due to the accuracy of the precise alignment process.

SUMMARY OF THE INVENTION

In accordance with the present invention, a novel processing sequence is described which utilizes a self-aligning gate region which serves not only as a mask for the source and drain diffusions, but also serves a function as contact region for the gate electrode.

Briefly, the inventive technique involves initially subjecting the semiconductor material of interest, bearing an insulating layer, to photoengraving techniques for the purpose of defining a gate area. Then, the gate oxide comprising an insulator and a metal-silicon-oxygen composition is grown or deposited on the substrate member. The metal-silicon-oxygen composition is preferably formed by an anodization process as described in the copending patent application. Source and drain regions are subsequently defined by standard photoengraving techniques using the gate region as a self-aligning gate mask. The source and drain diffusion is then carried out through window openings in an insulator layer formed on the semiconductor surface. Thus, by means of this process, wherein the growth of the gate oxide is prior to source and drain diffusion, post diffusion degradation and gate overlap over source and drain regions is eliminated.

In an alternative embodiment of the present invention, threshold voltage drift of the described device is successfully avoided by further minimizing or substantially depleting the process inherent charge carriers in the insulator. This end is attained by annealing the gate oxide in the presence of nitrogen, so yielding a nitride barrier layer between the gate oxide and the substrate surface.

DETAILED DESCRIPTION OF THE INVENTION

Figures 1A, 1B, 1C, 1D, 1E, 1F, 1G, 1H, 1I, 2:
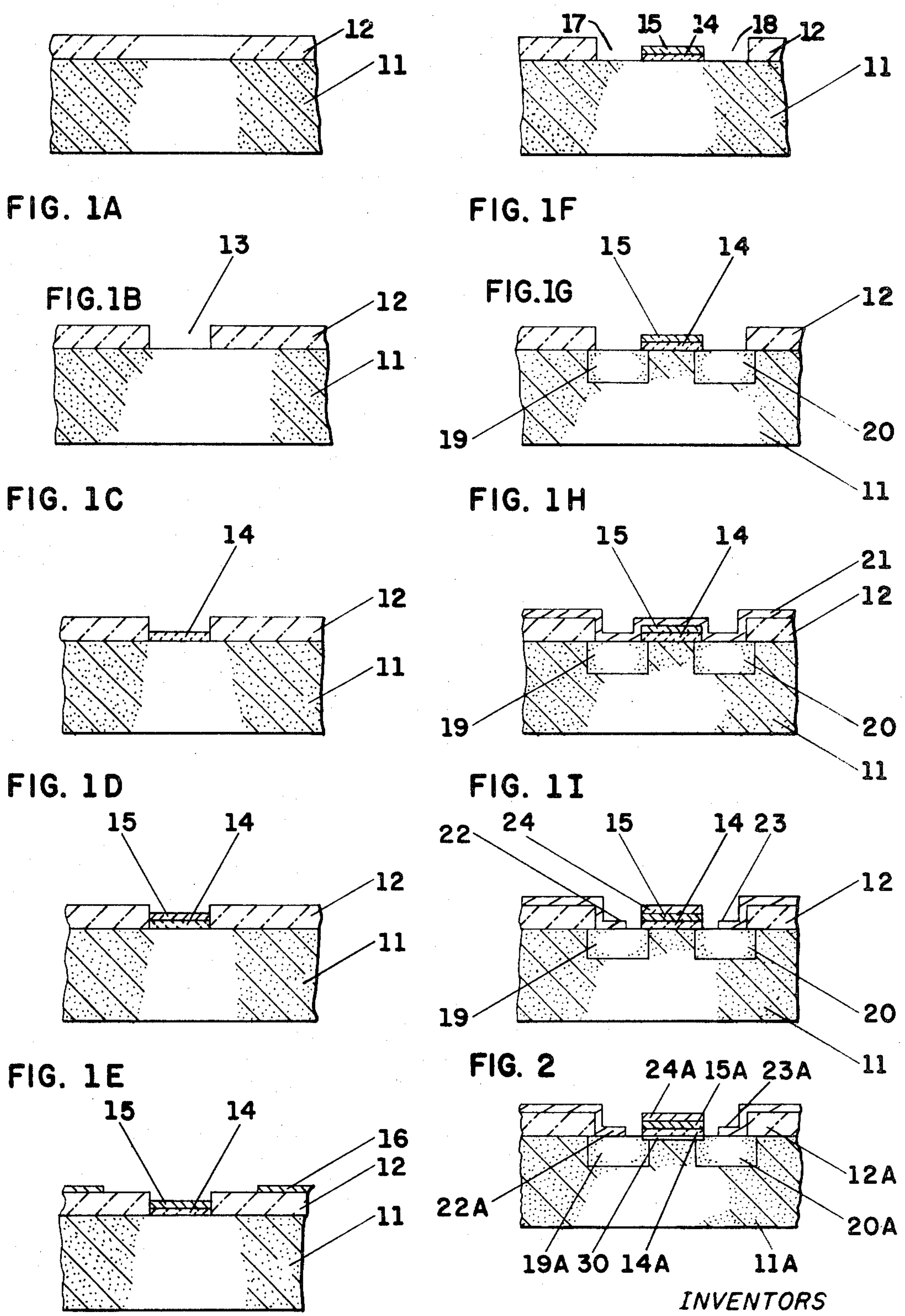

The invention will be more readily understood by reference to the following detailed description taken in conjunction with the accompanying drawings wherein:

FIGS. 1A–1I are front elevational views in cross section of a semiconductor material during successive states of manufacture of a field-effect transistor in accordance with the present invention; and FIG. 2 is a front elevational view in cross section of the device of FIG. 1I including a silicon nitride barrier layer in the gate region.

With reference now more particularly to the drawing, there is shown in FIG. 1A a front elevational view in cross section of a P-type silicon wafer 11 having a layer 12 of silicon dioxide thereon. It will be appreciated by those skilled in the art that any semiconductor material suitable for the end use alluded to hereinabove may be employed not withstanding conductivity type, the specific materials described having been chosen solely for purpose of exposition. Similarly, it will be understood that the semiconductor material may be obtained from commercial sources or grown by conventional crystal growth techniques. Insulating silicon dioxide layer 12 is conveniently formed by thermal oxide growth techniques or by pyrolitic, evaporation, or sputtering processes.

Subsequent to the formation of layer 12, a suitable aperture or gate hole is formed in layer 12 by conventional photolithographic masking and etching techniques. A buffered solution of hydrogen fluoride serves as a suitable etchant in this step. FIG. 1B shows the body of FIG. 1A, numeral 13 (gate hole) representing the area from which silicon dioxide was removed during etching.

The next step in the practice of the present invention involves the growth of a thin layer of silicon dioxide 14 (FIG. 1C) in the gate hole 13, such layer being conveniently grown by thermal oxide growth techniques or formed by any of the alternatives delineated above. The thickness of this layer has not been found to be critical but desirably ranges from about 75 A. to several hundred Angstroms.

Following, a passivating alloy layer 15 (FIG. 1D) containing a noble metal, silicon and oxygen is deposited upon layer 14 by anodization techniques utilizing a suitable electrolyte such as a hydrogen peroxide solution containing from 0.1 to 30 percent by volume $H_2O_2$ (in water). The noble metal chosen may be selected from among platinum, gold, silver, rhodium, palladium and iridium, a general preference being for platinum. Once again, it will be evident that other electrolytes may be chosen as well as generic procedures. The anodization process described herewith is disclosed in the earlier copending patent application.

During the course of the anodization process, positive ions which cause undesired surface stability problems, migrate away from the semiconductor-insulator surface area in the direction of the cathode due to the field generated in the anodization process. During anodization, alloy layer 15 is formed solely in the region above layer 14 without the necessity for masking due to the electric field provided by the portion of the P-region shielded by the thin oxide. The alloy layer 15 is thus formed on layer 14 without the presence of the deleterious positive ions at the silicon-dioxide interface. By controlling the concentration of the hydrogen peroxide anodization solution, the first incremental portion of the alloy layer 15 formed on layer 14 can be an insulating layer to avoid a pinhole problem in layer 14 and the remaining portion of layer 15 can be a conductive layer, thereby permitting layer 15 to be substantially an electrode or electrical contact with an insulating substrate. Alternatively, the entirety of layer 15 may be a conductive layer. The use of higher concentrations of hydrogen peroxide, which is the oxygen source for layer 15, provides more oxygen for layer 15, thereby resulting in an insulating alloy layer due to the formation of nonconducting, metal oxides. Similarly, a smaller concentration of hydrogen peroxide makes the alloy more electrically conductive, thereby acting as an electrode.

The next step in the practice of the present invention involves applying conventional photoresist masking and etching techniques upon oxide layer 12 for the purpose of defining the source and drain areas. Masking is not required in the region of the gate because of the inherent self-masking ability of the alloy gate material 15. The structure including photoresist layer 16 is shown in FIG. 1E.

FIG. 1F shows the assembly of FIG. 1E including source window 17 and drain window 18. This figure depicts the structure of the device after the removal of the oxide regions by standard oxide-etching techniques.

Following, a conventional diffusion operation is conducted for the purpose of forming N+ regions 19 and 20, respectively, beneath windows 17 and 18. In the diffusion operation, it has been found convenient to employ a dopant such as phosphorous or arsenic, an impurity concentration of the order of at least $10^{20}$ atoms per cubic centimeter being used. Region 19 serves as a source region and region 20 as a drain for the field-effect transistor being produced. The resultant structure is shown in FIG. 1G.

The next step in the processing sequence involves metal deposition wherein a suitable metal coating of ohmic contact-type material such as aluminun-type material is deposited over the entirety of the device surface. As shown in FIG. 1H, metal layer 21 forms ohmic contacts with source region 19 and drain region 20 and also provides an electrical contact to the noble metal-silicon-oxygen alloy electrode 15.

It may be advantageous in making electrical contact to regions of the semiconductor device to deposit, by anodization, the noble metal-silicon-oxygen contact directly on the surface of the device. This alloy contact layer serves as the electrode and some other conductive layer such as aluminum can be deposited on the electrode and on the oxide layer. This technique is employed to prevent possible shorting which occurs if the holes in the oxide layer are first cleaned out with an etchant in order to provide clean semiconductor surface for ohmic contact. This ohmic contact formation technique using a noble metal-silicon-oxygen alloy formed by anodization can also be used in transistor devices (Bipolar) in the formation of collector, base, or emitter contacts.

Finally, photolithographic masking and etching techniques are employed to etch away layer 21 to provide separate ohmic contacts to the N+-type source region 19 and the N+-type drain region 20. A separate electrical contact is also provided above the gate region of the device shown in FIG. 1I. Thus, the ohmic contact to the N+ source region 19 is shown by contact 22, the ohmic contact to the N+ drain region 20 by contact 23 and the metal contact or gate electrode for the gate region of the FET device is shown by metal electrode 24. The alloy layer 15 provides both a barrier layer to positive ion impurities from the external atmosphere in the vicinity of the gate electrode region which is critical to FET device stability and performance and an electrically conducting region close to the semiconductor substrate surface, thereby substantially reducing the amount of voltage required to operate the device.

FIG. 2 depicts the FET device of FIG. 1I with the addition of a silicon nitride layer 30 between the oxide layer 14A and the surface of the semiconductor substrate 11A. The numerals used in FIG. 2 are identical to the numerals used in FIG. 1I with the addition of the letter A. The silicon nitride layer 30 is formed right after the formation of the barrier layer 15 in FIG. 1D. The silicon nitride layer 30 is preferably formed by carrying out a heat treatment operation in a nitrogen atmosphere. The thin silicon nitride barrier layer 30 serves to prevent ion impurities from reaching the semiconductor surface thereby improving device stability.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for the fabrication of a semiconductor device comprising the steps of successively:
- a. forming an insulating layer upon one surface of a semiconductor substrate;
- b. removing a portion of said insulating layer to form an aperture therein and to expose a portion of said semiconductor surface;
- c. forming a thin insulating layer on the exposed surface portion of said semiconductor substrate;
- d. forming a passivating layer by anodization upon said thin insulating layer, said passivating layer consisting of an alloy of silicon, oxygen and at least one noble metal selected from the group consisting of platinum, gold, silver, rhodium, palladium and iridium;
- e. removing portions of said insulating layer to form apertures therein and to expose semiconductor surface areas adjacent the location of said passivating layer;
- f. forming regions of opposite-type conductivity in said semiconductor substrate; and
- g. forming metal electrodes in contact with portions of the surface of said substrate through apertures in said insulating layer.

2. A method in accordance with claim 1 wherein said noble metal serves as a cathode.

3. A method in accordance with claim 1 wherein said thin insulating layer is at least 75 A. in thickness.

4. A method in accordance with claim 2 wherein said noble metal is platinum.

5. A method in accordance with claim 4 wherein said insulating layer and said thin insulating layer comprise silicon dioxide.

6. A method for the fabrication of a semiconductor device in accordance with claim 1 including the step of annealing in the presence of nitrogen after formation of said passivating layer to form a silicon nitride barrier layer intermediate said substrate surface and said thin insulating layer.

7. A method for fabricating a semiconductor device comprising the steps of successively:
- a. thermally growing a first silicon dioxide layer on one surface of a silicon semiconductor substrate;
- b. removing a portion of said first silicon dioxide layer by photoengraving techniques, thereby partially exposing said semiconductor surface;
- c. forming a second silicon dioxide layer on said partially exposed semiconductor surface by thermal growth techniques;
- d. forming a passivating layer by anodization on said second silicon dioxide layer consisting of an alloy of silicon, oxygen and at least one noble metal selected from the group consisting of platinum, gold, silver, rhodium, palladium and iridium;
- e. removing portions of said first insulating layer by photoengraving techniques to expose portions of said semiconductor surface;
- f. diffusing impurities into said silicon substrate to form regions of opposite-type conductivity where portions of said semiconductor surface are exposed; and,
- g. forming metal electrodes in contact with said portions of the surface of said silicon semiconductor substrate.

8. A method in accordance with claim 7 wherein said substrate is of P-type conductivity and said diffused regions are of N-type conductivity.

9. A method for the fabrication of a semiconductor device comprising the steps of:

a. forming a passivating layer upon a thin insulating layer located on a portion of a semiconductor substrate surface;

b. forming regions of opposite-type conductivity in said semiconductor substrate adjacent the location of said passivating layer; and c. forming metal electrodes in contact with portions of the surface of said semiconductor substrate.

10. A method in accordance with claim 9 wherein said passivating layer consisting of an alloy of silicon, oxygen and at least one noble metal selected from the group consisting of platinum, gold, silver, rhodium, palladium and iridium.

11. A method in accordance with claim 10 wherein said passivating layer consisting of an alloy of silicon, oxygen and platinum.

12. A method in accordance with claim 9 wherein said regions of opposite-type conductivity in said semiconductor substrate being source and drain regions of a field-effect transistor.

13. A method in accordance with claim 12 wherein said passivating layer being an electrically conductive gate electrode.

14. A method for the fabrication of a semiconductor device comprising the steps of:

a. forming an electrically conductive layer by anodization upon a thin insulating layer located on a portion of a semiconductor substrate surface;

b. forming regions of opposite-type conductivity in said semiconductor substrate adjacent the location of said electrically conductive layer; and c. forming metal electrodes in contact with portions of the surface of said semiconductor substrate.

15. A method for the fabrication of a semiconductor device comprising the steps of:

a. forming thin and thick insulating layer by anodization regions on a semiconductor substrate surface;

b. forming a passivating layer upon said thin insulating layer;

c. forming regions of opposite-type conductivity in said semiconductor substrate adjacent the location of said passivating layer; and d. forming metal electrodes in contact with portions of the surface of said semiconductor substrate.

16. A method for the fabrication of a semiconductor device in accordance with claim 15 including the step of annealing in the presence of nitrogen after formation of said passivating layer to form a silicon nitride barrier layer intermediate said substrate surface and said thin insulating layer.

17. A method for the fabrication of an ohmic contact to a semiconductor device comprising the step of depositing by anodization an electrically conductive layer on opposed surface portions of a semiconductor substrate, said electrically conductive layer consisting of an alloy of silicon, oxygen and at least one noble metal selected from the group consisting of platinum, gold, silver, rhodium, palladium and iridium.

18. A method in accordance with claim 17 wherein said electrically conductive layer consisting of an alloy of silicon, oxygen and platinum.

* * * * *

UNITED STATES PATENT OFFICE
CERTIFICATE OF CORRECTION

Patent No. 3,634,204 Dated January 11, 1972

Inventor(s) Vir A. Dhaka et al

It is certified that error appears in the above-identified patent and that said Letters Patent are hereby corrected as shown below:

Column 3, line 1, after "the" insert -- silicon --. Column 6, line 7, after "layer" insert -- regions --; same line, "by anodization regions" should be deleted; line 8, after "layer" insert -- by anodization --.

Signed and sealed this 7th day of November 1972.

(SEAL)
Attest:

EDWARD M.FLETCHER,JR.
Attesting Officer

ROBERT GOTTSCHALK
Commissioner of Patents

ORM PO-1050 (10-69)

USCOMM-DC 60376-P69
☆ U.S. GOVERNMENT PRINTING OFFICE : 1969 O—366-334.